(12) United States Patent
Zhang et al.

(10) Patent No.: US 8,104,930 B2
(45) Date of Patent: Jan. 31, 2012

(54) LED MODULE

(75) Inventors: Hai-Wei Zhang, Shenzhen (CN);
Chin-Chung Chen, Taipei Hsien (TW);
Jia-Chuan Lv, Shenzhen (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 262 days.

(21) Appl. No.: 12/689,192

(22) Filed: Jan. 18, 2010

(65) Prior Publication Data
US 2011/0103070 A1    May 5, 2011

(30) Foreign Application Priority Data
Oct. 29, 2009 (CN) .............................. 200910309045

(51) Int. Cl.
*F21V 3/00* (2006.01)
(52) U.S. Cl. ......... 362/311.02; 362/311.01; 362/311.06; 362/334; 362/335
(58) Field of Classification Search ............. 362/311.01, 362/311.02, 311.06, 311.08, 311.1, 334, 362/35, 222, 223
See application file for complete search history.

(56) References Cited

U.S. PATENT DOCUMENTS

| 7,841,750 | B2 * | 11/2010 | Wilcox et al. ................. 362/334 |
| 2010/0259151 | A1 * | 10/2010 | Chen et al. .................... 313/110 |

* cited by examiner

*Primary Examiner* — Evan Dzierzynski
(74) *Attorney, Agent, or Firm* — Altis Law Group, Inc.

(57) ABSTRACT

An LED module includes an LED and a lens covering the LED. The LED has an optical axis. The lens has an incident face for incidence of light of the LED into the lens and an opposite emitting face for refracting the light of the LED out of the lens. The emitting face has two elongated, ellipsoid lateral surfaces and a middle surface located between and connecting with the two ellipsoid lateral surfaces. The incident face has a sidewall and a ceiling connecting to a top of the sidewall. The middle surface of the emitting face and the ceiling of the incident face are corresponding to each other and inclined laterally relative to the optical axis of the LED.

19 Claims, 6 Drawing Sheets

LED MODULE

BACKGROUND

1. Technical Field

The present disclosure relates generally to LED modules, and more particularly to an LED module with an improved lens.

2. Description of Related Art

LED module, a solid-state lighting, utilizes LEDs as a source of illumination, providing advantages such as resistance to shock and nearly limitless lifetime under specific conditions. Thus, LED modules present a cost-effective yet high quality replacement for incandescent and fluorescent lighting.

Known implementations of an LED module employ lenses for focusing light generated by the LEDs. However, a light pattern provided by such an LED module is substantially round, and is not suitable for illuminating a certain location, such as a roadway, which has a need to be able to direct light to a middle of the roadway instead of lighting on a region neighboring a roadside of the roadway, such as houses beside the roadway. Apparently, the round light pattern provided by the conventional LED module can not satisfy such a requirement.

What is need therefore is an LED module which can overcome the above limitations.

DETAILED DESCRIPTION

FIGS. 1 to 5 illustrate an LED module in accordance with an exemplary embodiment. The LED module includes an LED 10 and a lens 20 covering the LED 10.

Figure 1:
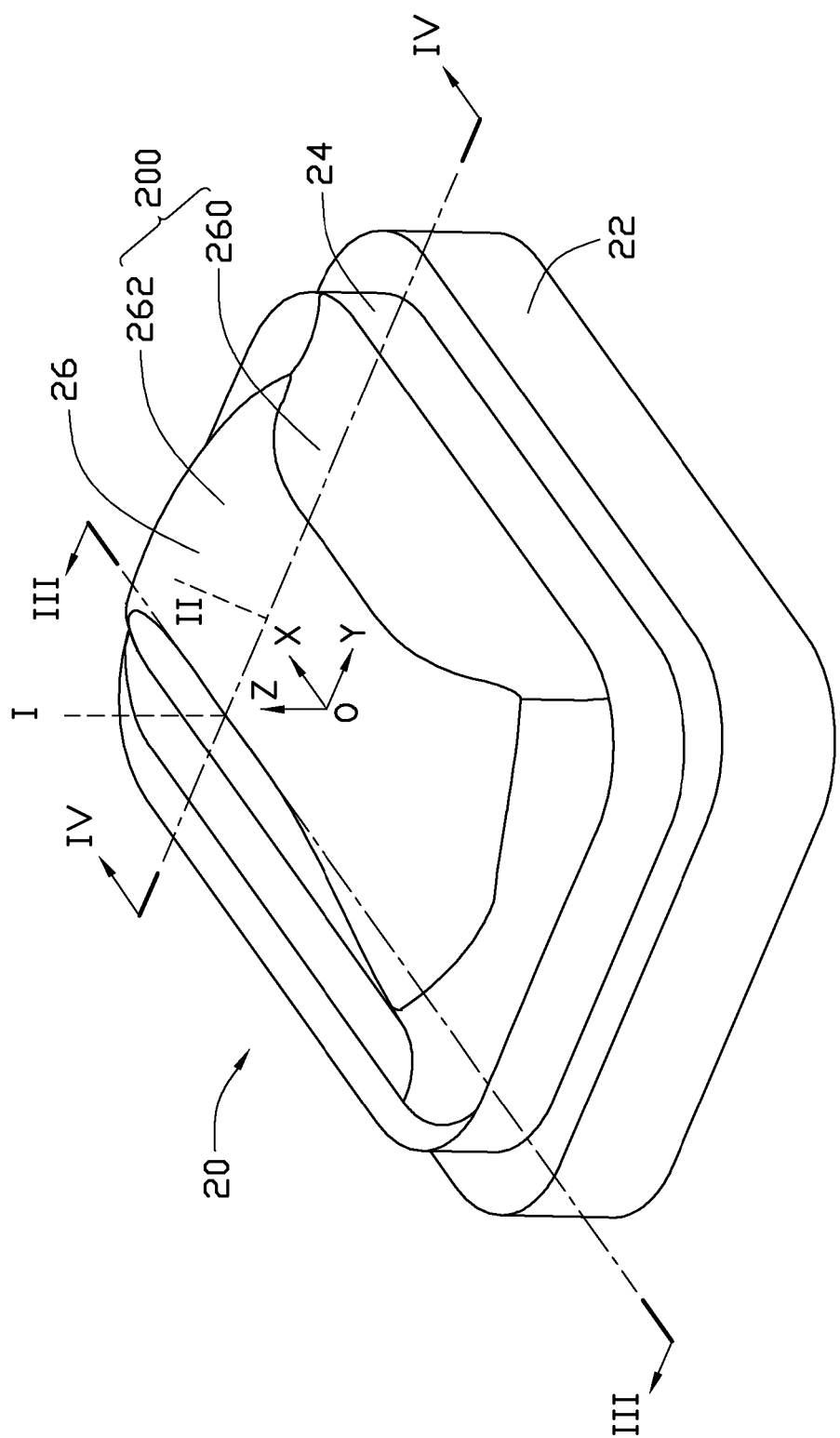
FIG. 1 is an isometric, assembled view of an LED module in accordance with an embodiment.

Referring to FIG. 1, a three dimensional coordinate system, with origin O and axes X, Y and Z, oriented as shown by the arrows in FIG. 1, is applied to clearly describe the LED module. The X-axis extends along a front-to-rear direction, the Y-axis extends along a left-to-right direction, and the Z-axis extends along a bottom-to-top direction. Any two of the three axes X, Y, Z are perpendicular to each other. The X-axis and the Z-axis cooperatively define a first plane XOZ. The Y-axis and the Z-axis cooperatively define a second plane YOZ. The X-axis and the Y-axis cooperatively define a third plane XOY. The first plane XOZ and the second plane YOZ are vertical, and are perpendicularly intersected at the Z-axis. The third plane XOY is horizontal, perpendicularly intersected to the first plane XOZ at the X-axis and perpendicularly intersected to the second plane YOZ at the Y-axis.

Figure 3:
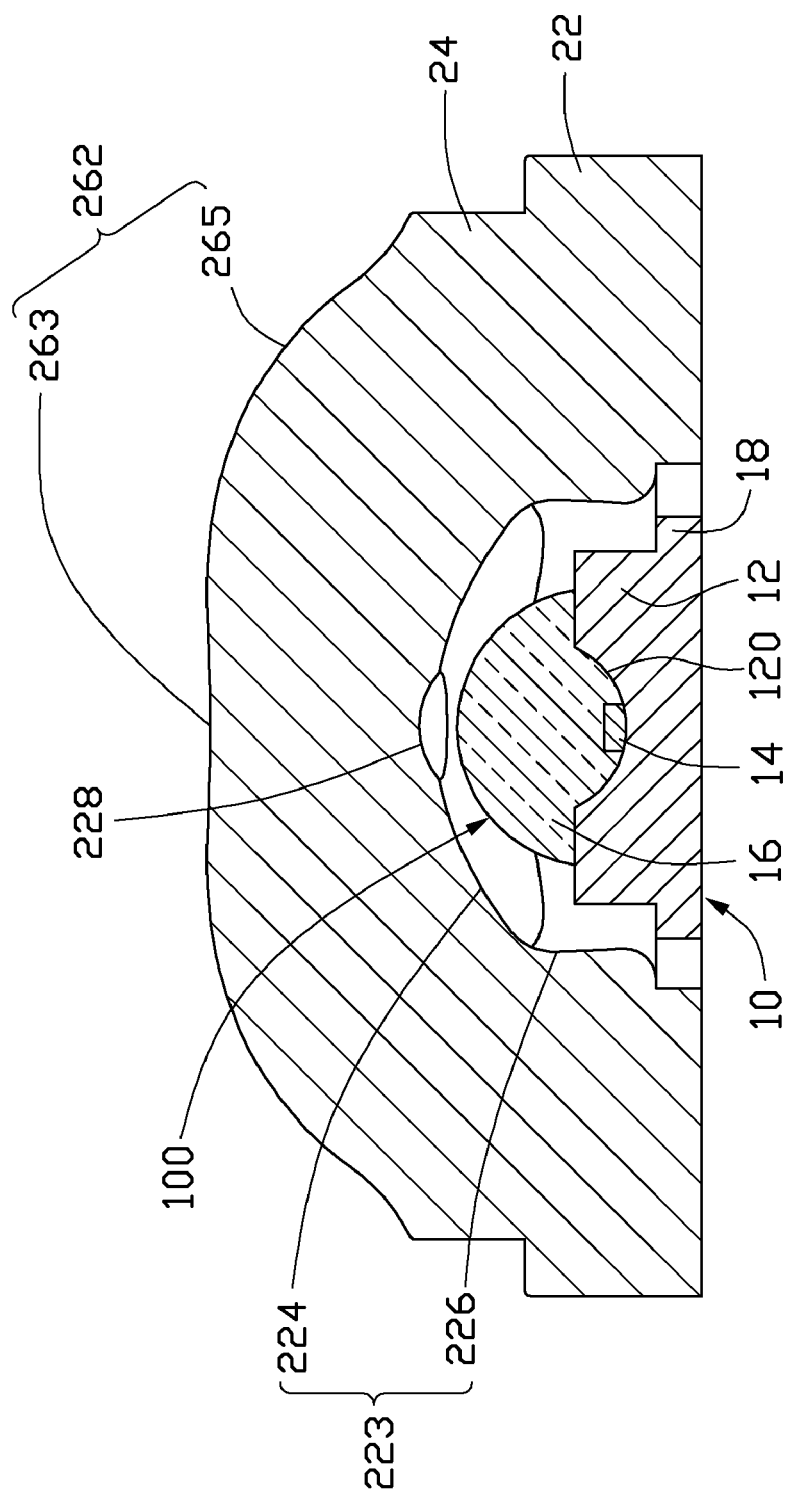
FIG. 3 is a cross-sectional view of the LED module of FIG. 1, taken along line thereof.
Figure 4:
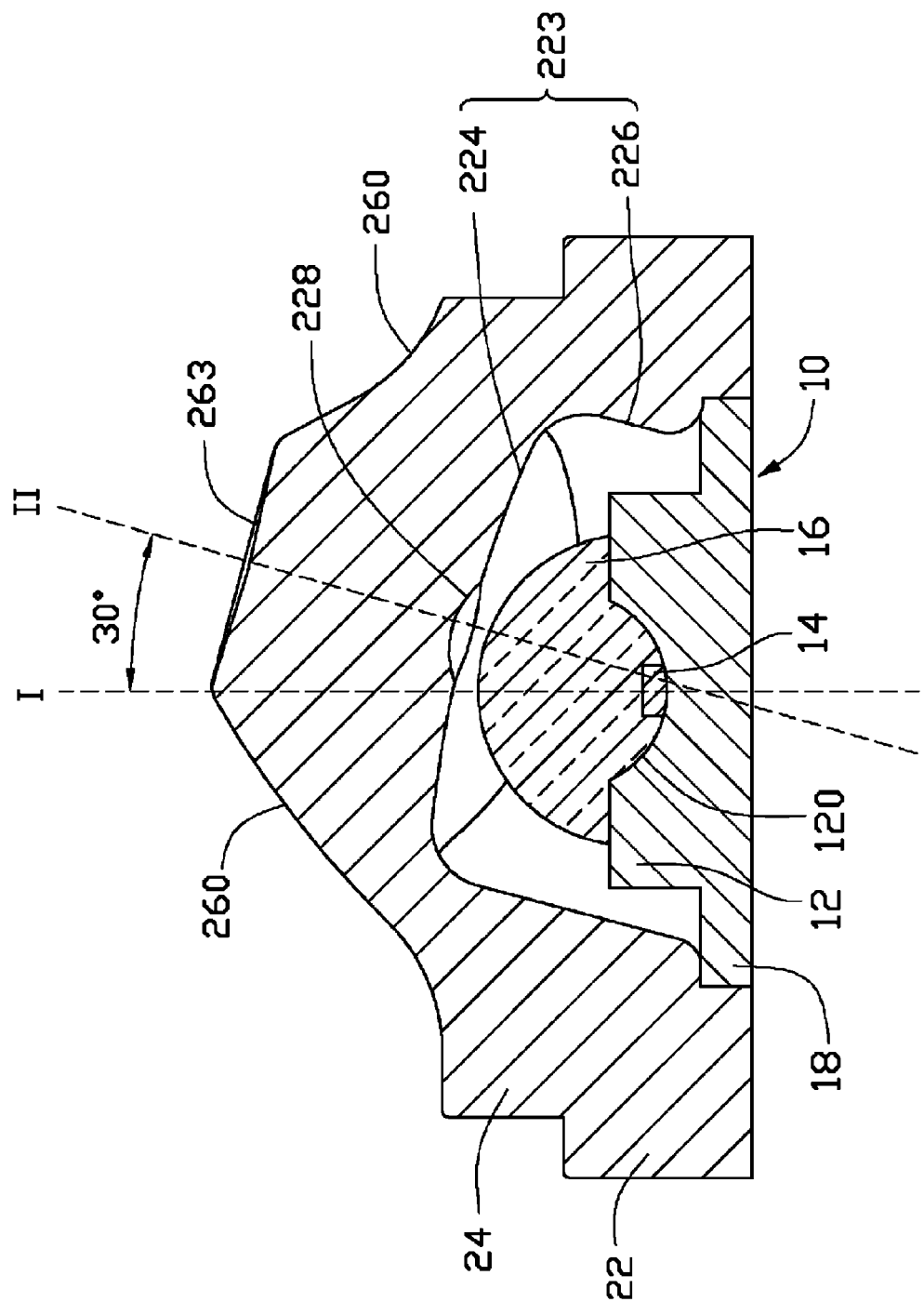
FIG. 4 is a cross-sectional view of the LED module of FIG. 1, taken along line IV-IV thereof.

Referring to FIGS. 3 and 4, the LED 10 includes a rectangular substrate 12, an LED chip 14 and an encapsulant 16. A flange 18 extends outwardly from each lateral side of the substrate 12 for mounting the substrate 12 to the lens 20. A recess (not labeled) is defined in a top of the substrate 12. The LED chip 14 is received in and located at a center of the recess. The substrate 12 forms a bowl-shaped reflecting surface 120 at a bottom of the recess for reflecting light generated by the LED chip 14 to the encapsulant 16. The encapsulant 16 fills the recess and thus fixes the LED chip 14 on the substrate 12. A profile of the encapsulant 16 is substantially dome-shaped for being acted as a primary convex lens to collimate light emitted from the LED chip 14. An outer surface of the encapsulant 16 functions as an emitting surface 100 of the LED 10. Preferably, in this embodiment, the emitting surface 100 is spherical, and has an optical axis I coincidental with the Z-axis. In other words, the optical axis I vertically extends through the origin O of the X-Y-Z coordinate. The LED chip 14 is located in alignment with the optical axis I of the LED 10. In other words, the optical axis I extends through a center of the LED chip 14.

Referring to FIG. 1 again, the lens 20 is integrally made of a light-transparent material, such as PC (polycarbonate) or PMMA (polymethyl methacrylate). The lens 20 is elongated in profile with long sides extending along the X-axis and short sides extending along the Y-axis. The lens 20 is symmetric relative to the second plane YOZ, and is asymmetric relative to the first plane XOZ.

Figure 2:
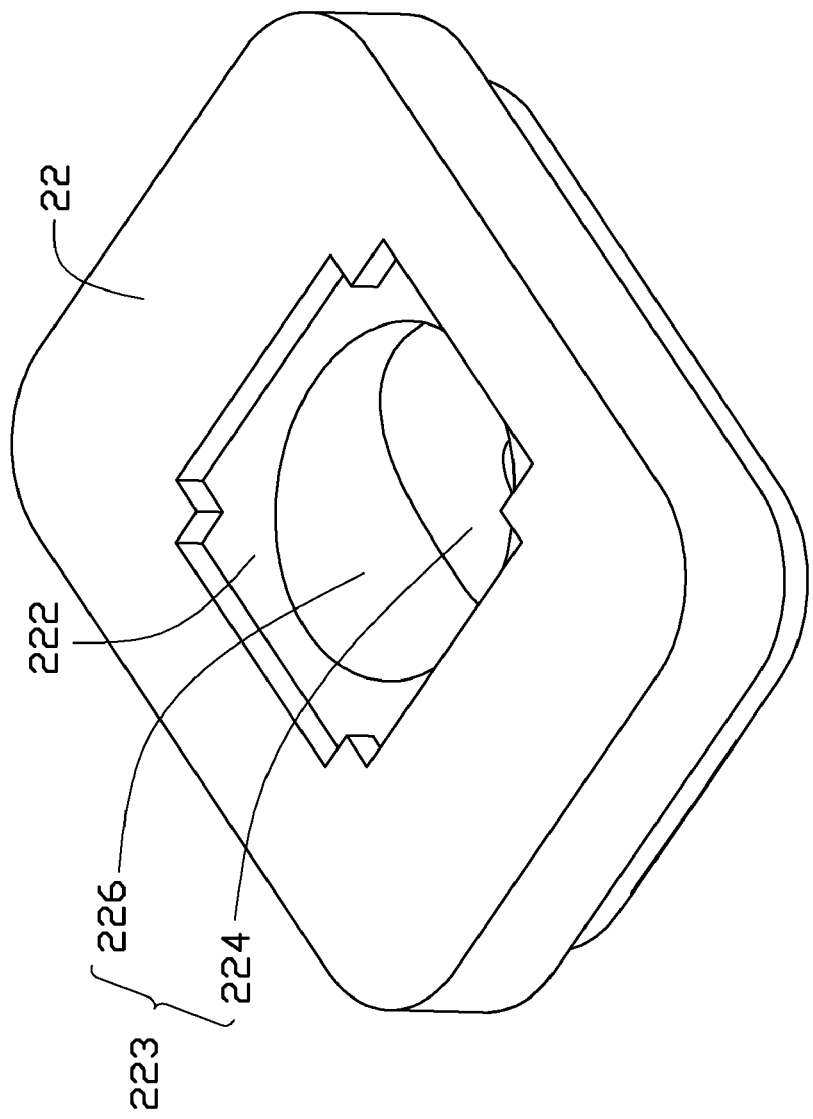
FIG. 2 is an inverted view of a lens of the LED module of FIG. 1.

Referring to FIG. 2 simultaneously, the lens 20 includes a supporting base 22, a connecting member 24 and a guiding member 26 extruding upwardly from a central part of a top of the connecting member 24. The supporting base 22 is substantially rectangular in shape. The connecting member 24 is formed on a top side of the supporting base 22. The connecting member 24 is substantially rectangular, and has a length and a width both being smaller than those of the supporting base 22. An outer surface of the guiding member 26 functions as an emitting face 200 of the LED module for extracting the light of the LED 10 out of the LED module. The emitting face 200 refracts the light out of the lens 20. The emitting face 200 in whole has a profile being generally convex.

Also referring to FIGS. 3 and 4, the emitting face 200 includes two elongated, ellipsoid lateral surfaces 260 extending upwardly and inwardly from two longer sides of the guiding member 26, and a middle surface 262 located between and connecting with the two ellipsoid lateral surfaces 260. An optical axis II of the emitting face 200 of the LED module extends through a center of the middle surface 262. The two ellipsoid lateral surfaces 260 are generally convergent upwardly towards the optical axis II. The optical axis II of the emitting face 200 of the LED module is at a predetermined angle, such as 30 degrees (particularly shown in FIG. 4) to the optical axis I of the emitting surface 100 of the LED 10. The optical axis II of the emitting face 200 and the optical axis I of the emitting surface 100 both are located on the second plane YOZ.

The middle surface 262 is a compound irregular surface consisted of some different surfaces. In this embodiment, the middle surface 262 has a slight concave plane 263 located at a middle top thereof and two spheroid surfaces 265 located at two ends of the concave plane 263. The concave plane 263 of the middle surface 260 is located at a right side of optical axis I (particularly shown in FIG. 4). That is, the guiding member 26 protrudes along the optical axis II and deviates rightwards from the optical axis I. The two ellipsoid lateral surfaces 260 of the emitting face 200 are different from each other and are arranged at two sides of the middle surface 262, respectively. One of the ellipsoid lateral surfaces 260 at a left side of the concave plane 263 (shown in FIG. 4) is bulged outwardly along the bottom-to-top direction, while another one of the ellipsoid lateral surfaces 260 at a right side of the concave plane 263 (shown in FIG. 4) is recessed inwardly along the bottom-to-top direction. That is, the ellipsoid lateral surface 260 at the left side of the concave plane 263 is a convex slope, while the ellipsoid lateral surface 260 at the right side of the concave plane 263 is a concave slope. A top edge of the ellipsoid lateral surface 260 at the left side of the concave plane 263 is higher than a top of the ellipsoid lateral surface 260 at the opposite right side of the concave plane 263. A width of each ellipsoid lateral surface 260 increases gradually from two ends to a middle of the lens 20, while a width of the middle surface 262 decreases gradually from the two ends to the middle. Bottom sides of the ellipsoid lateral surfaces 260 and two bottom edges of the middle surface 262 connect with the top side of the connecting member 24.

Referring to FIGS. 2 to 5, the lens 20 defines a cavity 222 at a central portion of the supporting base 22 for receiving the substrate 12 of the LED 10 therein. The cavity 222 is depressed inwardly from a bottom of the lens 20 and inclined towards the concave plane 263 of the emitting face 200. An inner wall of the cavity functions as an incident face 223 of the lens 20 for incidence of the light of the LED 10 into the guiding member 26 of the lens 20.

The incident face 223 in whole has a profile being generally concave upwardly. The incident face 223 comprises a ceiling 224 and a sidewall 226. The ceiling 224 has a centrosymmetric, dome-shaped configuration and is centrosymmetric relative to the optical axis II. That is, the optical axis II extends through a center of the ceiling 224. The ceiling 224 is also inclined rightwards to the optical axis I at the second plane YOZ, corresponding to the concave plane 263 of the emitting face 200 of the lens 20. The sidewall 226 of the incident face 223 is cylindrical and extends inclinedly upwardly along the optical axis II to connect with a round edge of the ceiling 224. The sidewall 226 has every point thereon spaced from the optical axis with an equal distance. A step (not labeled) is defined at an opening of the cavity 222. When the substrate 12 of the LED 10 is received in the cavity 222, a circumferential portion of a top surface of the substrate 12 abuts against the step to mount the LED 10 in the lens 20 and limit a movement of the LED 10 along the Z-axis. The light incident face 223 is further recessed towards the light emitting face 200 to form a spherical surface 228 at a center of the ceiling 224. The spherical surface 228 is located at the right side of the optical axis I and centrosymmetric relative to the optical axis II, for collimating light from the LED 10 towards the middle surface 262 of the emitting face 200 of the lens 20.

Figure 6:
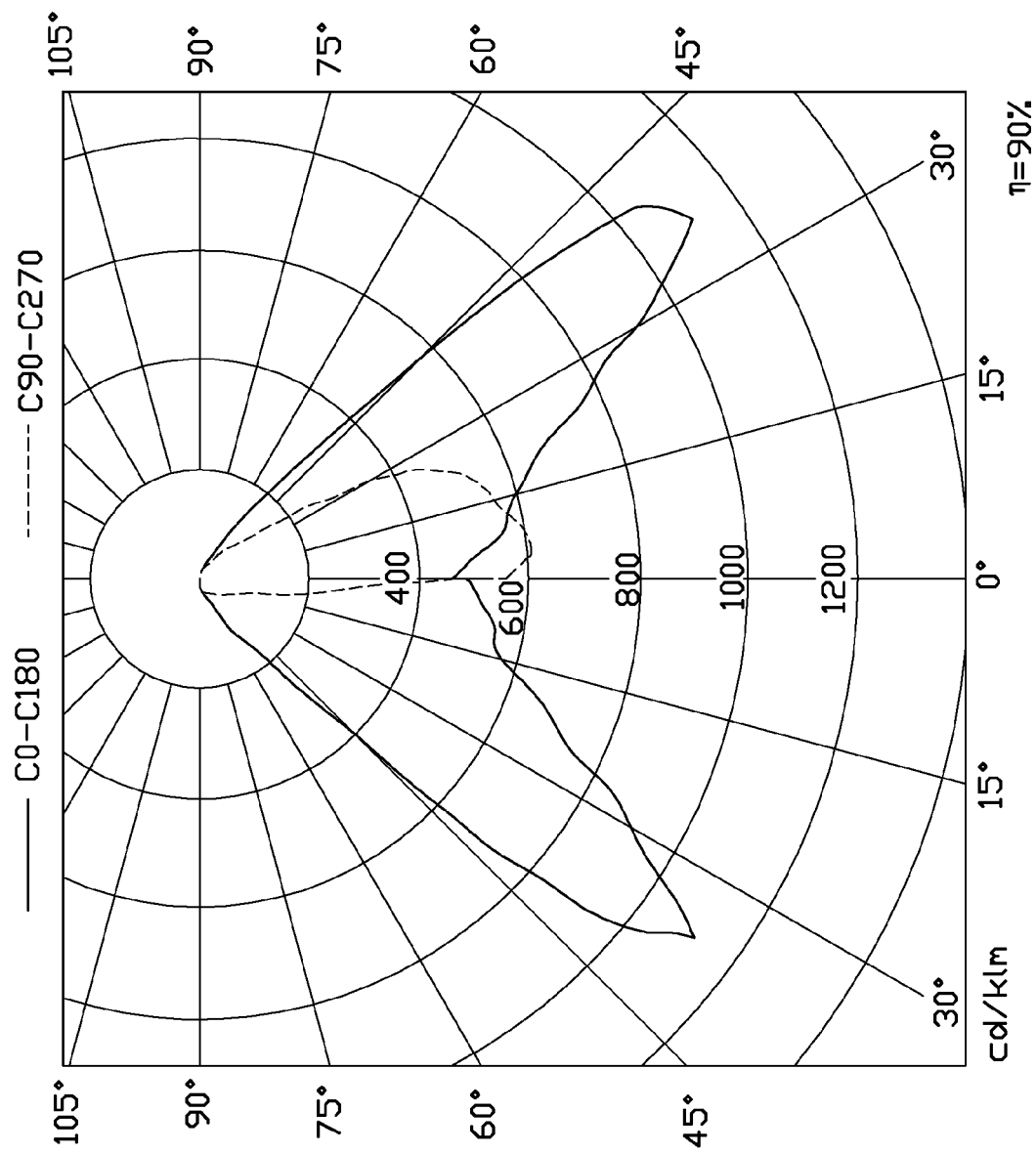
FIG. 6 is a graph of light intensities vs. radiating angles of the LED module of FIG. 1.

FIG. 6 shows a dotted line and a solid line respectively indicating the intensities of the light of the present LED module, i.e., the light emitted from the emitting face 20, in the first plane XOZ and the second plane YOZ vs. the radiating angles of the LED module. Since the lens 20 is symmetric to the second plane YOZ, the intensities at opposite sides of the second plane YOZ are substantially identical to each other, as indicated by the solid line of FIG. 6.

Figure 5:
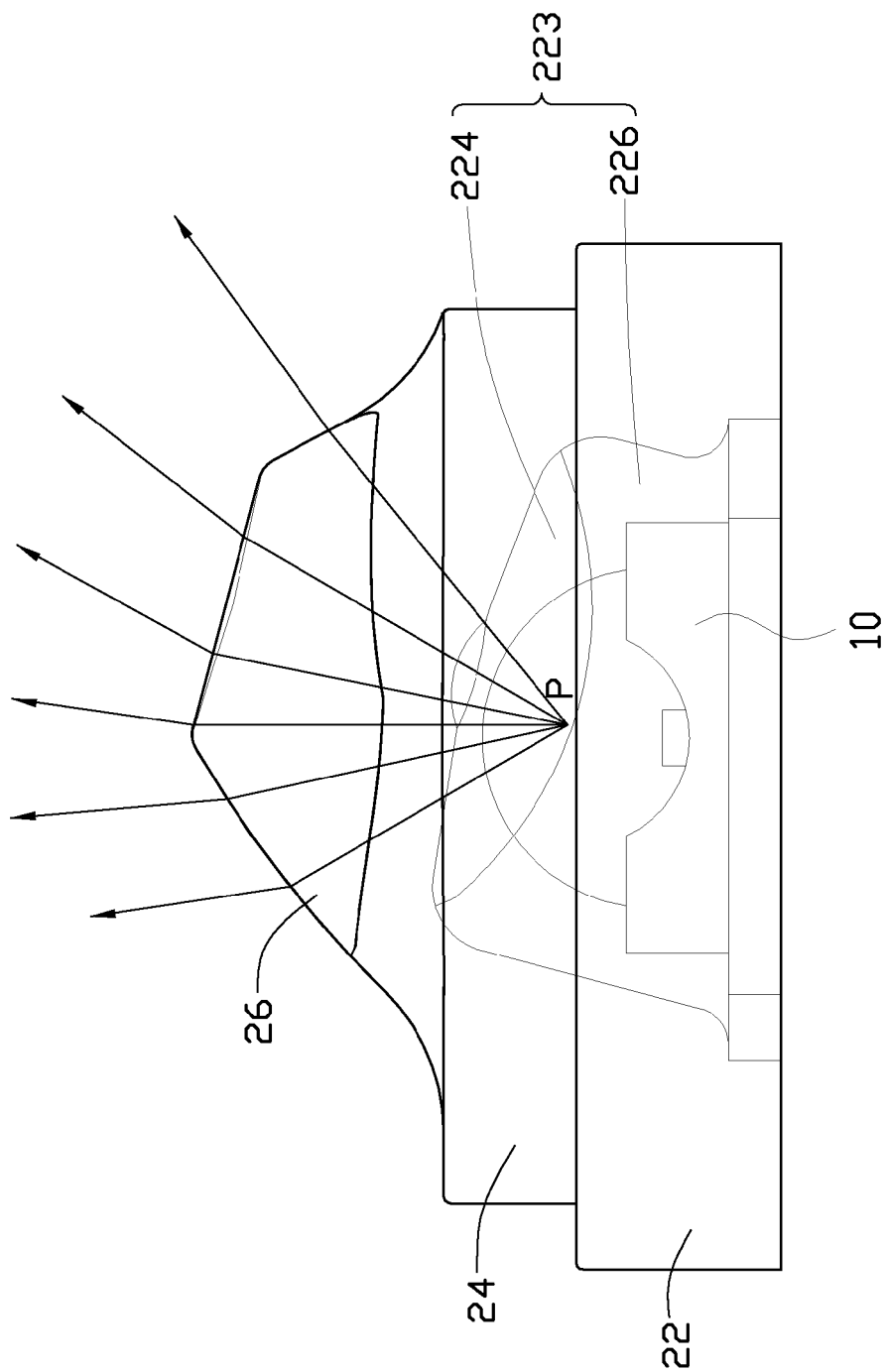
FIG. 5 is a front side view of the LED module of FIG. 1 with arrows indicating the light radiation of an LED from a point "P" at an incident face of the lens.

Furthermore, since the optical axis II of the incident face 223 of the lens 20 and the emitting face 200 of the LED module at the predetermined angle (30 degrees) to the optical axis I of the LED 10, most of the light emitted from the LED 10 is refracted out of the lens 20 and biases rightwards along the optical II, as shown in FIG. 5. Thus intensities of the light of the LED module at opposite sides of the first plane XOZ are quite different from each other.

Taking the second plane YOZ for example, as indicated by the dotted line of FIG. 6, the intensities of the light of the LED module in the right side of the optical axis I of the LED 10 is much larger than that at the left side of the optical axis I. In the right side, with an increase of the radiating angle between the light and the optical axis I of the LED 10 from 0 degree to 35 degrees, the intensity of the light of the LED module firstly increases to the peak and then decreases to about ⅓ of the peak in sequence. When the radiating angle is 6 to 8 degrees, the peak intensity in the right side occurs, and when the radiating angle is 35 degree, the intensity of light is ⅓ of the peak intensity. When the radiating angle is 0 degrees, the intensity of light is about 90% of the peak intensity. With a further increase of the radiating angle over 35 degrees, the intensity of light decreases sharply to zero.

In the left side of the of the optical axis I of the LED 10, with an increase of the angle between the light and the optical axis I from 0 to 10 degrees, the intensities of the light of the LED module decreases continuously and sharply to about ⅓ of the peak intensity.

When the present LED module is utilized as a street module on a side of a road, the lens 20 of the LED module is arranged in such a manner that the X-axis is parallel to a longitudinal direction of the road, while the Y-axis is parallel to a transverse direction of the road. The right side of the lens 20 towards which the guiding member protrudes is adjacent a middle of the road, while the opposite left side of the lens 20 is adjacent to a road side of the road. That is, the middle surface 262 of the emitting face 200 and the ceiling 224 of the incident face 223 incline rightwards simultaneously toward a middle of the road. The light emitted from the LED 10 is refracted by the lens 20 to form a substantially elongated illumination region on the road. An illumination area along the longitudinal direction of the road is larger than that along the transverse direction of the road. An illumination area along the transverse direction of the road biases from the roadside of the road towards the middle of the road to thereby provide a sufficient illumination for the middle of the road. In other words, in the transverse direction, more light are directed to the middle of the road than the roadside.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED module comprising:
   an LED having an optical axis; and
   a lens covering the LED, the lens having an incident face for incidence of light of the LED into the lens and an opposite emitting face for refracting the light of the LED out of the lens, the emitting face comprising two elongated, ellipsoid lateral surfaces and a middle surface located between and connecting with the two ellipsoid lateral surfaces, the incident face comprising a sidewall and a ceiling connecting to a top of the sidewall;
   wherein the middle surface of the emitting face and the ceiling of the incident face are corresponding to each other and inclined laterally relative to the optical axis of the LED.

2. The LED module of claim 1, wherein the incident face is concave, while the emitting face is convex, the LED being entirely received in the lens and spaced from the incident face.

3. The LED module of claim 1, wherein a top edge of the ellipsoid lateral surface at one side of the middle surface is higher than a top edge of the ellipsoid lateral surface at another opposite side of the middle surface, the two ellipsoid lateral surfaces being convergent upwardly towards an optical axis of the emitting face which extends through a center of the middle surface and is inclined relative to the optical axis of the LED.

4. The LED module of claim 3, wherein the ellipsoid lateral surface at the one side of the middle surface is a convex slope, while the ellipsoid lateral surface at the another opposite side of the middle surface is a concave slop.

5. The LED module of claim 4, wherein a width of the middle surface of the emitting face decreases from two ends to a middle of the lens, and widths of the ellipsoid lateral surfaces increase from two the ends to the middle of the lens.

6. The LED module of claim 1, wherein the middle surface comprises a slight concave plane located at a middle top thereof and two spheroid surfaces located at two ends of the concave plane.

7. The LED module of claim 6, wherein the optical axis of the emitting face extends through a center of the ceiling of the incident face and a center of the concave plane of the middle surface of the emitting face.

8. The LED module of claim 7, wherein the two optical axes are at an acute angle to each other, the middle surface of the emitting face and the ceiling of the incident face protruding outwardly along the optical axis of the emitting face.

9. The LED module of claim 8, wherein the acute angle between the two optical axes is 30 degrees.

10. The LED module of claim 7, wherein a first plane is defined by the two optical axes and a second plane is defined perpendicular to the first plane and intersecting with the first plane at the optical axis of the LED, and wherein the lens is symmetric relative to the second plane, while is asymmetric relative to the first plane.

11. The LED module of claim 10, wherein an intensity of light generated by the LED is distributed asymmetrically in the second plane, more light generated by the LED is distributed to one side of the optical axis of the LED through which the optical axis of the emitting face extends.

12. The LED module of claim 1, wherein the sidewall of the incident face is cylindrical, inclines relative to the optical axis of the LED and has every point thereon spaced from the optical axis of the emitting face with an equal distance.

13. An LED module comprising:
an LED having an optical axis I; and
a lens receiving the LED in a bottom thereof, the lens having an incident face protruding outwardly and enclosing the LED and an opposite emitting face outside of the incident face of the lens, the emitting face comprising two elongated, ellipsoid lateral surfaces and a middle surface located between and connecting with the two ellipsoid lateral surfaces, the incident face comprising a sidewall and a ceiling connecting to a top of the sidewall, the lens having an optical axis II which is at an acute angle to the optical axis I and extends through a center of the middle surface and a center of the incident face simultaneously;
wherein the middle surface of the emitting face and the ceiling of the incident face are corresponding to each other and directed to a direction along the optical axis II.

14. The LED module of claim 13, wherein a top edge of the ellipsoid lateral surface at one side of the middle surface is higher than a top edge of the ellipsoid lateral surface at another opposite side of the middle surface, the two ellipsoid lateral surfaces being convergent outwardly towards the optical axis II.

15. The LED module of claim 14, wherein the ellipsoid lateral surface at the one side of the middle surface is a convex slope, while the ellipsoid lateral surface at the another opposite side of the middle surface is a concave slope.

16. The LED module of claim 15, wherein a width of the middle surface of the emitting face decreases from two ends to a middle of the lens, and widths of the ellipsoid lateral surfaces increase from two the ends to the middle of the lens.

17. The LED module of claim 13, wherein the middle surface comprises a slight concave plane located at a middle top thereof and two spheroid surfaces located at two ends of the concave plane.

18. The LED module of claim 17, wherein the axis I is at an acute angle to the axis II along which the middle surface of the emitting face and the ceiling of the incident face protrude outwardly.

19. The LED module of claim 18, wherein the acute angle between the axes I and II is 30 degrees.

\* \* \* \* \*